(12) United States Patent
Setani et al.

(10) Patent No.: US 8,896,099 B2
(45) Date of Patent: Nov. 25, 2014

(54) CARBON MATERIAL AND METHOD OF MANUFACTURING THE SAME

(75) Inventors: Kaoru Setani, Kanonji (JP); Hiroaki Matsunaga, Kanonji (JP); Akiyoshi Takeda, Kanonji (JP)

(73) Assignee: Toyo Tanso Co., Ltd., Osaka-shi (JP)

( * ) Notice: Subject to any disclaimer, the term of this patent is extended or adjusted under 35 U.S.C. 154(b) by 0 days.

(21) Appl. No.: 13/983,788

(22) PCT Filed: Feb. 21, 2012

(86) PCT No.: PCT/JP2012/054042
§ 371 (c)(1),
(2), (4) Date: Aug. 6, 2013

(87) PCT Pub. No.: WO2012/115072
PCT Pub. Date: Aug. 30, 2012

(65) Prior Publication Data
US 2013/0313685 A1    Nov. 28, 2013

(30) Foreign Application Priority Data
Feb. 21, 2011  (JP) ................. 2011-034384

(51) Int. Cl.
| | |
|---|---|
| *H01L 21/02* | (2006.01) |
| *C04B 41/50* | (2006.01) |
| *C04B 41/87* | (2006.01) |
| *H01L 29/12* | (2006.01) |
| *C04B 35/52* | (2006.01) |
| *C04B 41/00* | (2006.01) |

(52) U.S. Cl.
CPC ............ *H01L 29/12* (2013.01); *C04B 41/5057* (2013.01); *C04B 41/87* (2013.01); *C04B 35/52* (2013.01); *H01L 21/02521* (2013.01); *C04B 41/009* (2013.01)
USPC ........................................ 257/613

(58) Field of Classification Search
USPC ................. 428/408, 698; 427/249.1; 257/613
See application file for complete search history.

(56) References Cited

U.S. PATENT DOCUMENTS 5,789,077 A * 8/1998 Nakahama et al. .......... 428/336
2011/0244267 A1  10/2011 Takeda

FOREIGN PATENT DOCUMENTS

| JP | 07-033567 A | 2/1995 |
|---|---|---|
| JP | 08-143384 A | 6/1996 |
| JP | 08-143385 A | 6/1996 |
| WO | 2010067734 A1 | 6/2010 |

OTHER PUBLICATIONS

JP07033567 translation.*
International Search Report dated May 29, 2012, issued in corresponding application No. PCT/JP2012/054042.
Office Action dated Mar. 21, 2014, issued in Chinese Patent Application No. 201280005997.9 with English Translation (18 pages).

* cited by examiner

*Primary Examiner* — Whitney T Moore
(74) *Attorney, Agent, or Firm* — Westerman, Hattori, Daniels & Adrian, LLP

(57) ABSTRACT

By inhibiting generation of particles, a carbon material and a method of manufacturing the carbon material are provided that can be used in the field of semiconductor manufacturing or the like, in which low dust emission is considered important.

A carbon material having a chromium carbide layer formed on a surface of a carbon substrate. The chromium carbide layer is composed of $Cr_3C_2$. The carbon material can be manufactured through a first step of forming a chromium carbide layer containing a chromium carbide other than $Cr_3C_2$ on a surface of a carbon substrate, and a second step of heat-treating the carbon substrate under a reducing atmosphere to convert the chromium carbide other than $Cr_3C_2$ into $Cr_3C_2$.

13 Claims, 4 Drawing Sheets

CARBON MATERIAL AND METHOD OF MANUFACTURING THE SAME

TECHNICAL FIELD

The present invention relates to a carbon material and a method of manufacturing the same. More particularly, the invention relates to a carbon material that is surface-modified and inhibited from producing particles, and a method of manufacturing the same.

BACKGROUND ART

Carbon materials are light in weight and excellent in chemical and thermal stability, and moreover, they show good thermal conductivity and electrical conductivity even though they are non-metal materials. However, their uses are limited in, for example, semiconductor manufacturing processes because they have the characteristic of dust emission.

In view of the problem, it has been proposed that, as shown in Patent Documents 1 and 2 listed below, a chromium carbide layer composed of $Cr_{23}C_6$ is provided on the surface of a carbon substrate by treating the carbon substrate with a chromium halide gas. However, when a chromium carbide with a high composition ratio of chromium, such as $Cr_{23}C_6$, is formed, the hardness of the chromium carbide becomes high, so chipping tends to occur easily in handling or the like. As a consequence, particles are produced, so a problem with the material is that the material cannot be used for the members for which their characteristic of emitting less dust are considered important, such as the members (for example, jigs) used in a semiconductor manufacturing apparatus.

CITATION LIST

Patent Literature

[Patent Document 1] Japanese Published Unexamined Patent Application No. H08 (1996)-143384 A
[Patent Document 2] Japanese Published Unexamined Patent Application No. H08 (1996)-143385 A

SUMMARY OF INVENTION

Technical Problem

The present invention has been accomplished in view of the foregoing problem, and it is an object of the invention to provide, by inhibiting generation of the particles, a carbon material that can be used, for example, in the field of semiconductor manufacturing, and a method of manufacturing the carbon material.

Solution to Problem

In order to accomplish the foregoing object, the present invention provides a carbon material comprising a carbon substrate and a chromium carbide layer formed on a surface of the carbon substrate, characterized in that the chromium carbide layer comprises $Cr_3C_2$ as its main component.

When the chromium carbide layer comprises $Cr_3C_2$ as its main component, the composition ratio of chromium becomes smaller than that of $Cr_{23}C_6$ or the like (the composition ratio of carbon is greater). Therefore, the hardness becomes lower (becomes softer) and chipping does not likely to occur easily in handling or the like. As a result, the generation of particles (characteristic of dust emission) can be inhibited, so the carbon material can be used in the field in which the characteristic of emitting less dust is considered important, such as in the field of semiconductor manufacturing. It should be noted that the phrase "the chromium carbide layer comprises $Cr_3C_2$ as its main component" means that the proportion of $Cr_3C_2$ in the chromium carbide layer exceeds 50 weight %.

Here, it is desirable that the number of particles of 0.2 μm or greater be less than 100, more desirably less than 50, per 100 $mm^2$ of the surface of the carbon material, the number of particles being determined by immersing and washing the carbon material in pure water, thereafter applying an ultrasonic wave to the washed carbon material in 3000 mL of pure water to extract particles, and counting the number of the particles with a particle counter.

Also, it is desirable that the number of particles of 0.1 μm or greater be less than 1000, more desirably less than 500, per 100 $mm^2$ of the surface of the carbon material, the number of particles being determined by immersing and washing the carbon material in pure water, thereafter applying an ultrasonic wave to the washed carbon material in 3000 mL of pure water to extract particles, and counting the number of the particles with a particle counter.

Furthermore, it is preferable that the chromium carbide layer mainly have a rhombic structure.

In order to accomplish the foregoing object, the present invention also provides a method of manufacturing a carbon material, comprising: a first step of forming a chromium carbide layer containing a chromium carbide other than $Cr_3C_2$ on a surface of a carbon substrate; and a second step of heat-treating the carbon substrate under a reducing atmosphere to convert the chromium carbide other than $Cr_3C_2$ into $Cr_3C_2$.

This method makes it possible to manufacture the above-described carbon material. Note that it is sufficient that the chromium carbide layer prior to the heat treatment contain a chromium carbide other than $Cr_3C_2$. Therefore, the chromium carbide layer prior to the heat treatment may either consist of a chromium carbide other than $Cr_3C_2$ alone, or contain $Cr_3C_2$ and the chromium carbide other than $Cr_3C_2$.

In the first step, it is desirable that a carbon substrate embedded in a surface modifying agent containing chromium particles and a pyrolytic hydrogen halide generating agent be heat-treated together with a carbon member other than the carbon substrate, to form the chromium carbide layer containing a chromium carbide other than $Cr_3C_2$ on the surface of the carbon substrate.

Such a method makes it possible to form the chromium carbide layer easily.

It is desirable that the chromium carbide other than $Cr_3C_2$ comprise at least one chromium carbide selected from the group consisting of $Cr_2C$, $Cr_7C_3$, and $Cr_{23}C_6$. It is also desirable that the reducing atmosphere be a hydrogen gas atmosphere.

It is desirable that, in the second step, the heat treatment be performed at from 500° C. to 1500° C.

Here, the temperature in the heat treatment is restricted to from 500° C. to 1,500° C. for the following reason. If the temperature is less than 500° C., $Cr_2C$ and the like may not be converted into $Cr_3C_2$. On the other hand, even if the temperature exceeds 1,500° C., the conversion rate cannot be increased any higher, and moreover, the energy loss may become greater, increasing the manufacturing cost of the carbon material. In order to smoothly convert the chromium carbide other than $Cr_3C_2$ into $Cr_3C_2$ and to reduce the manufacturing cost of the carbon material, it is particularly preferable that the temperature be from 800° C. to 1100° C.

It is desirable that, in the second step, the heat treatment be performed under a reduced pressure of from 10 Pa to 1000 Pa.

The reason is that, if the pressure is higher than 1000 Pa or less than 10 Pa, the costs of the equipment and the gas used for the treatment will be too high, so it is impracticable. In addition, it is preferable that the pressure be within the range of from 10 to 1000 Pa because the structure of the equipment can be made simple and at the same time the conversion effect can sufficiently be obtained. Moreover, it is preferable that the chromium carbide layer subsequent to the treatment be in a rhombic structure composed mainly of $Cr_3C_2$.

Advantageous Effects of Invention

The present invention can inhibit the generation of particles (characteristic of dust emission) and therefore enables the carbon material to be used in the field in which the characteristic of emitting less dust is considered important, such as in the field of semiconductor manufacturing. Significant advantageous effects can be obtained, for example, that when the carbon material of the present invention is used as a jig in the field of semiconductor manufacturing, it becomes possible to prevent adhering of the particles to the counterpart material.

DESCRIPTION OF EMBODIMENTS

Figure 1:
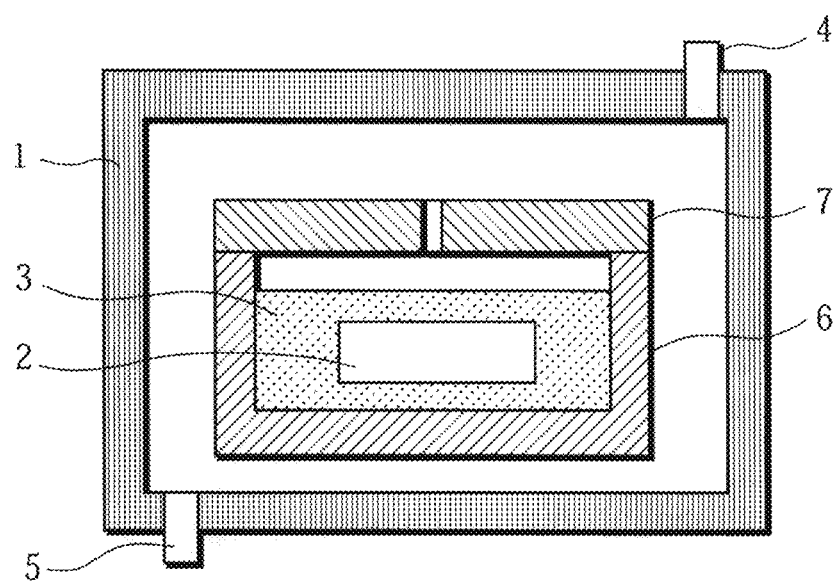
FIG. 1 is a diagram illustrating one example of an apparatus used in the method of manufacturing a carbon material described in the present invention.

Hereinbelow, the present invention will be described in detail.

The present invention is a carbon material having a carbon substrate and a chromium carbide layer formed on a surface of the carbon substrate, the chromium carbide layer composed of $Cr_3C_2$. This carbon material can be manufactured through a first step of forming a chromium carbide layer containing a chromium carbide other than $Cr_3C_2$ on a surface of a carbon substrate, and a second step of heat-treating under a reducing atmosphere. In this case, it is preferable to use a CVR method in the first step of forming a chromium carbide layer containing a chromium carbide other than $Cr_3C_2$ (hereinafter, the chromium carbide layer containing a chromium carbide other than $Cr_3C_2$ may be referred to simply as "the chromium carbide layer") on a surface of the carbon substrate. It is preferable that the heat treatment in the second step be performed under a reduced pressure of from 10 Pa to 1000 Pa and within a temperature range of from 500° C. to 1500° C.

Hereinbelow, the carbon material prior to the heat treatment will be described in detail.

The just-mentioned carbon material (i.e., the carbon material prior to being subjected to the heat treatment in the second step) can be fabricated by, for example, heat-treating a carbon substrate embedded in a surface modifying agent (in a powdery state) containing chromium particles and a pyrolytic hydrogen halide generating agent or the like, together with a carbon member other than the carbon substrate (the first step).

Examples of the carbon member include a container made of carbon, such as a graphite crucible, and carbon powder. By heat-treating the carbon substrate to be treated together with the carbon member in this way, a chromium carbide layer can be formed on the carbon substrate in a short time.

The heat treatment in the first step can form the chromium carbide layer without color unevenness and almost uniformly on the carbon substrate within a treatment time of less than 1 hour. This chromium carbide layer can be formed sufficiently within a treatment time of as long as 30 minutes. The treatment time may be longer, for example, 1 hour or longer, if the chromium carbide layer needs to be thicker. In addition, it is preferable that the heat treatment in the first step be performed at from 500° C. to 1500° C., more preferably at from 800° C. to 1200° C. By treating within this temperature range, the carbon substrate can be treated efficiently.

It is preferable that the heat treatment in the first step be performed under normal pressure. Since the treatment can be performed under normal pressure, the equipment such as a vacuum pump is unnecessary, and the time required for reducing the pressure is also unnecessary. As a result, the treatment becomes simpler, and the treatment time reduces.

Hereinbelow, the components and members used in the present invention will be shown as one example.

Examples of the carbon substrate include, but not particularly limited to, isotropic graphite materials, anisotropic graphite materials, and carbon fiber materials.

It is preferable that the carbon substrate have a bulk density of from 1.0 g/cm$^3$ to 2.1 g/cm$^3$ and a porosity of 40% or less.

The pyrolytic hydrogen halide generating agent is such that is kept in a solid state under room temperature and normal pressure but is decomposed by heating to generate a hydrogen halide such as hydrogen chloride, hydrogen fluoride, and hydrogen bromide. It is preferable that the heat decomposition temperature of the pyrolytic hydrogen halide generating agent be 200° C. or higher, so that the handling before the heating can be easy. The hydrogen halide generated from the pyrolytic hydrogen halide generating agent reacts with chromium during the heat treatment and produces a chromium halide gas. By treating the carbon substrate with the chromium halide gas, the chromium carbide layer can be formed on a surface of the carbon substrate. Since the treatment of the carbon substrate is conducted with a gas, as described above, the chromium carbide layer can be formed substantially uniformly on the carbon substrate even when the carbon substrate has a complicated shape with, for example, holes and grooves. It is preferable that the pyrolytic hydrogen halide generating agent be ammonium chloride from the viewpoint of availability.

Examples of the carbon member include a container made of carbon, such as a graphite crucible, and carbon powder.

With the use of the carbon member, the treatment time of the carbon substrate can be shortened, and the need of the hydrogen gas supply can be eliminated. As a result, the surface modification of the carbon substrate can be achieved in a simpler manner and more easily.

It is preferable that the carbon member be a graphite crucible. The use of a graphite crucible in the treatment makes it possible to suppress the flow of the gas around the embedded carbon substrate, and to form the chromium carbide layer without color unevenness and more uniformly on the surface of the carbon substrate. Moreover, the gas produced from the powder can be kept in the graphite crucible to a certain degree, so the produced gas can be utilized effectively. It is preferable that a lid be placed on the graphite crucible, and the lid serves to further suppress the flow of the gas around the carbon substrate. Examples of the lid include one made of graphite, and a sheet made of graphite. In order to release the gas produced in the container, it is preferable that an air hole be provided in the container or in the lid. When using a sheet made of graphite, the air hole is not particularly necessary since the sheet merely covers the container.

When using carbon powder as the carbon member, the chromium particles, the pyrolytic hydrogen halide generating agent, and the carbon powder may be filled in the container, then the carbon substrate may be embedded in the powder filled in the container, and the carbon substrate may be heat-treated. When using carbon powder as the carbon member, the container is not particularly limited. In the treatment, it is possible to suppress the flow of the gas in the container by, for example, putting a lid or a sheet made of graphite on the container. It is also possible to use the above-mentioned graphite crucible as the container.

The container in which the carbon substrate is embedded is so configured that an introduced gas is not directly blown therein. Conversely, if an attempt is made to carry out the treatment while introducing a hydrogen gas, it is difficult to efficiently perform the treatment using the hydrogen gas because the container, such as the graphite crucible, hinders the introduction of hydrogen gas.

Next, one example of the apparatus that is used for the manufacture of the carbon material (the carbon material prior to being subjected to the heat treatment in the second step) and for the heat treatment will be described with reference to FIG. 1. The following is described about a case in which a graphite crucible is used as the carbon member in manufacturing the carbon material (the carbon material prior to being subjected to the heat treatment).

(1) when the Apparatus is Used for Manufacturing the Carbon Material (the Carbon Material Prior to being Subjected to the Heat Treatment in the Second Step)

The just-mentioned apparatus has a heating furnace 1 having a heater, and is configured to heat-treat a material to be treated, which is placed in the heating furnace 1. The heating furnace 1 is provided with a gas inlet port 4 and a gas exhaust port 5. The gas inlet port 4 is configured so that an inert gas such as nitrogen gas or argon gas can be introduced therefrom, while the gas exhaust port 5 is configured to naturally exhaust the inert gas or the like therefrom.

In the present apparatus, a graphite crucible 6 may be disposed in the heating furnace 1. The graphite crucible 6 is configured so that the powder 3 (surface modifying agent) can be filled in the graphite crucible 6, and a carbon substrate 2 to be treated can be embedded in the powder 3. The powder 3 contains a pyrolytic hydrogen halide generating agent and chromium particles. The graphite crucible 6 is configured to be closed by a lid 7, and the lid 7 has an air hole.

When the carbon material (the carbon material prior to being subjected to the heat treatment in the second step) is manufactured with the above-described apparatus of FIG. 1, the powder 3 is filled in the graphite crucible 6, which is a carbon member, then the carbon substrate 2 is embedded in the powder 3 filled in the crucible, and the lid 7 is put thereon. Then, the graphite crucible 6 is placed in the apparatus and heated at 800° C. to 1500° C. Thus, the method of manufacturing the carbon material can be implemented.

(2) when the Apparatus is Used for the Heat Treatment in the Second Step

Hereinbelow, only the points that are different from the case where the apparatus is used for manufacturing the carbon material (the carbon material prior to the heat treatment in the second step) will be described.

When conducting the heat treatment in the second step, the apparatus is configured as follows. A reducing gas such as $H_2$ gas can be introduced from the gas inlet port 4, while the gas exhaust port 5 is joined to a vacuum pump, which is not shown in the drawings, so that the pressure of the interior of the heating furnace 1 can be reduced. The carbon material (the carbon material prior to the heat treatment) is disposed on a support plate, which is disposed between it and the graphite crucible 6 and is made of a carbon material.

When the heat treatment is performed with the above-described apparatus of FIG. 1, the carbon material is placed directly in the apparatus, and thereafter the apparatus is evacuated using a vacuum pump until the internal pressure of the apparatus becomes from 10 Pa to 10000 Pa. Next, while introducing a reducing gas such as a $H_2$ gas from the gas inlet port 4, the internal temperature of the apparatus is elevated to a temperature of from 500° C. to 1500° C. (preferably from 800° C. to 1100° C.). This condition is kept for 1 minute to 30 hours, whereby the heat treatment is implemented. Such a restriction is made for the following reason. If the time of the heat treatment is less than 1 minute, $Cr_2C$, $Cr_7C_3$, $Cr_{23}C_6$, and the like may not be converted into $Cr_3C_2$. On the other hand, if there is a time of as long as 30 hours, the conversion can be made sufficiently. From these viewpoints and from the viewpoint of preventing energy loss, it is especially preferable that the time of the heat treatment be from 5 hours to 25 hours.

The amount of chromium needs to be varied according to the surface area of the carbon substrate, but it is preferable that amount of chromium be restricted to about 0.6 g to about 0.9 g (especially about 0.7 g to about 0.8 g) per 1 $cm^2$ of the carbon substrate. The reason is that when the amount is restricted in this way, the chromium carbide layer having such a film thickness as will be described below can be obtained.

In addition, when ammonium chloride is used as the pyrolytic hydrogen halide generating agent, it is preferable that the weight ratio of the chromium powder to the ammonium chloride be restricted to 6:1 to 7:1. The reason is as follows. If the amount of the ammonium chloride powder is too low, the chromium carbide layer is not produced sufficiently on the carbon substrate. On the other hand, if the amount of the ammonium chloride powder is too high, the hydrogen halide is supplied excessively, so that the metal carbide layer is not produced sufficiently on the carbon substrate. Taking this matter into consideration, it is particularly desirable that the weight ratio of the chromium powder and the ammonium chloride be from 6:1 to 7:1.

In addition, it is preferable that the chromium carbide layer have a thickness of from 1 μm to 50 μm. The reason is as follows. If the thickness of the chromium carbide layer is less than 1 μm, it is difficult to modify the entire surface of the carbon to be treated. On the other hand, if the thickness of the chromium carbide layer exceeds 50 μm, the dimensional change of the finally produced carbon material becomes too great, so the dimensional control is difficult.

EXAMPLES

Hereinbelow, the present invention will be described in further detail based on examples thereof. However, the present invention is not limited thereto.

Example

Using an apparatus shown in FIG. 1, a mixture powder of chromium powder (106.8 g), ammonium chloride ($NH_4Cl$) powder (15.6 g), and alumina ($Al_2O_3$) powder (520.4 g) was filled in a graphite crucible (made by Toyo Tanso Co., Ltd, Model number IG-11), and a carbon substrate (high-density isotropic graphite subjected to cold isotropic pressure forming: bulk density 1.8 $g/cm^3$, average pore radius 5 μm, porosity 20%, dimensions (approximate dimensions) 10 mm×10 mm×60 mm [surface area: 2600 $mm^2$]) was embedded in the mixture powder filled in the crucible. The crucible was placed in a heating furnace with a lid put thereon, and a heat treatment was performed. When heating, nitrogen was introduced from the gas inlet port, and the gas was discharged naturally from the gas exhaust port. Thus, the carbon material prior to the heat treatment is produced. The temperature in the heat treatment was 1000° C., and the treatment time was 30 minutes. The film thickness of the chromium carbide layer was 2 μm to 3 μm, and the chromium carbide layer almost consisted of $Cr_2C$.

Next, using the same apparatus, the carbon material produced in the above-described manner was placed directly in the apparatus, and thereafter, the apparatus was evaluated using a vacuum pump until the pressure in the apparatus became 150 Pa. Next, while introducing a $H_2$ gas from the gas inlet port 4, the internal temperature of the apparatus was elevated to 1100° C., and this condition was kept for 20 hours, whereby the heat treatment was implemented. Thus, the $Cr_2C$ was converted into $Cr_3C_2$, and the chromium carbide layer comprised $Cr_3C_2$ as its main component, as shown in the later-described Experiment 3.

The carbon material fabricated in this manner is hereinafter referred to as a present invention material A.

Comparative Example 1

A carbon material was fabricated in the same manner as described in Example above, except that the heat treatment was not performed. Thus, the $Cr_2C$ is not converted into $Cr_3C_2$, so the chromium carbide layer almost consists of $Cr_2C$, as shown in the later-described Experiment 4.

The carbon material fabricated in this manner is hereinafter referred to as a comparative material Z1.

Comparative Example 2

A carbon substrate was used as the carbon material (i.e., a chromium carbide layer is not formed on the surface of the carbon substrate).

The carbon material fabricated in this manner is hereinafter referred to as a comparative material Z2.

Experiment 1

The particle amount of each of the present invention material A and the comparative materials Z1 and Z2 were determined in the following manner. The results are shown in Table 1.

—Measurement Method of Particle Amount

Each of the materials were immersed in pure water and sufficiently washed (washed for 5 minutes or longer). Thereafter, an ultrasonic wave was applied to each of the washed test specimens in 3000 mL of pure water to extract particles, and the number of the particles was measured using a particle counter (XP-L7W made by Rion Co., Ltd.). Then, the number of the particles per unit surface area (100 mm$^2$) of each of the materials was determined.

TABLE 1

| | | Chromium carbide layer | | | Number of particles (Number/100 mm$^2$) | | | | |
|---|---|---|---|---|---|---|---|---|---|
| | | | Proportion of C and Cr (mol %) | | | | | | |
| Material | Heat treatment | Layer | C | Cr | >0.1 µm | >0.15 µm | >0.2 µm | >0.3 µm | >0.5 µm |
| Present invention material A | Yes | Present | 34.1 | 65.9 | 206 | 77 | 41 | 21 | 10 |
| Comparative material Z1 | No | Present | 12.3 | 87.7 | 3.6 × 10$^5$ | 2.1 × 10$^5$ | 2320 | 1392 | 928 |
| Comparative material Z2 | No | Absent | — | — | 5 × 10$^5$ | 2 × 10$^5$ | 3 × 10$^4$ | 5000 | 2500 |

Experiment 2

Assuming the dust emission under the conditions such that another material is brought into contact with or rubbed against the present invention material A and the comparative material Z1, a measurement of the number of particles was carried out. The results are shown in Table 2 below.

—Measurement Method of Aerial Particles

The surface (490 mm$^2$) of each of the comparative material Z1 and the present invention material A was traced 15 times a minute with a body of a needle pinched by a thumb and a finger. The emitted particles were trapped and measured using a surface particle detector (surface particle detector QIII+ made by Pentagon Technologies). Then, the number of the emitted particles per unit surface area (100 mm$^2$) of each of the materials was determined.

TABLE 2

| | | Chromium carbide layer | | | Particle amount |
|---|---|---|---|---|---|
| | | | Proportion of C and Cr (mol %) | | (Number/ 100 mm$^2$) |
| Material | Heat treatment | Layer | C | Cr | >1 µm |
| Present invention material A | Yes | Present | 34.1 | 65.9 | 43 |
| Comparative material Z1 | No | Present | 12.3 | 87.7 | 1146 |

As is clear from Tables 1 and 2, the comparative material Z1, in which the chromium carbide layer is formed on the surface of the carbon substrate, shows a less particle amount than the comparative material Z2, in which the chromium carbide layer is not formed on the surface of the carbon substrate. However, the number of particles needs to be further reduced in order to use the material in the field of semiconductor manufacturing or the like. In contrast, the present invention material A, which has been heat-treated after forming the chromium carbide layer on the surface of the carbon substrate, shows a remarkably lower particle amount than not only the comparative material Z2 but also than the comparative material Z1. This demonstrates that it can be sufficiently used in the field of semiconductor manufacturing. Moreover, the present invention material A clearly suppresses the formation of particles to a lower level even when friction against another material occurs, and therefore, the risk of the particle formation is very low at the time of use and handling of the material. It is preferable that the number of particles caused by such friction be less than 500, more preferably less than 100, per unit area (100 mm$^2$)

Experiment 3

Figure 2:
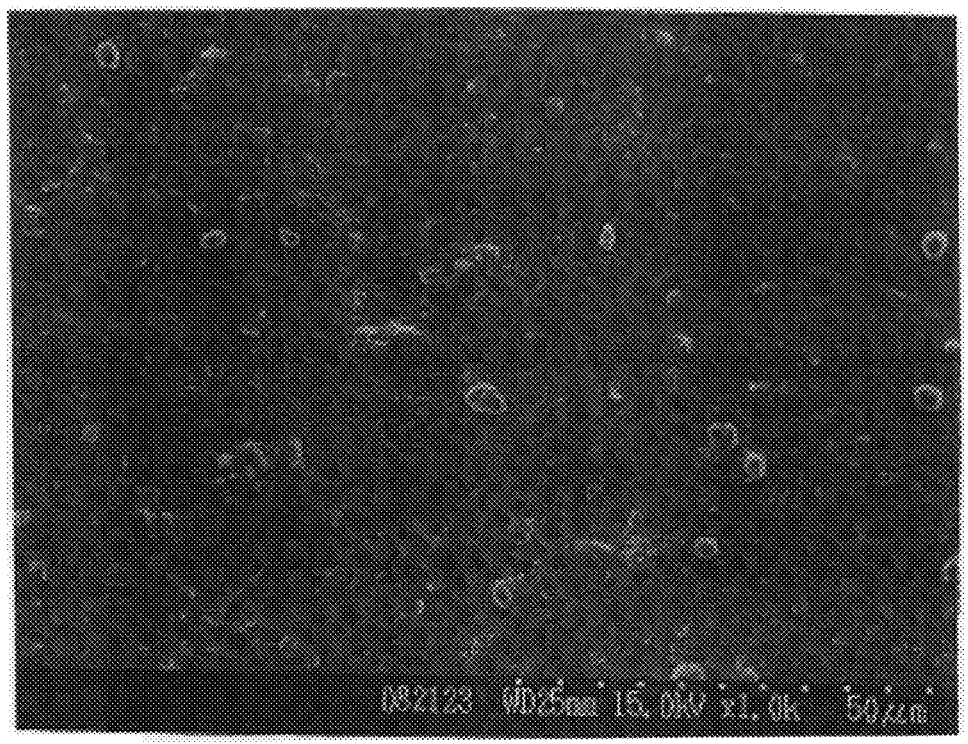
FIG. 2 is a SEM image of a surface of comparative material Z1.
Figure 3:
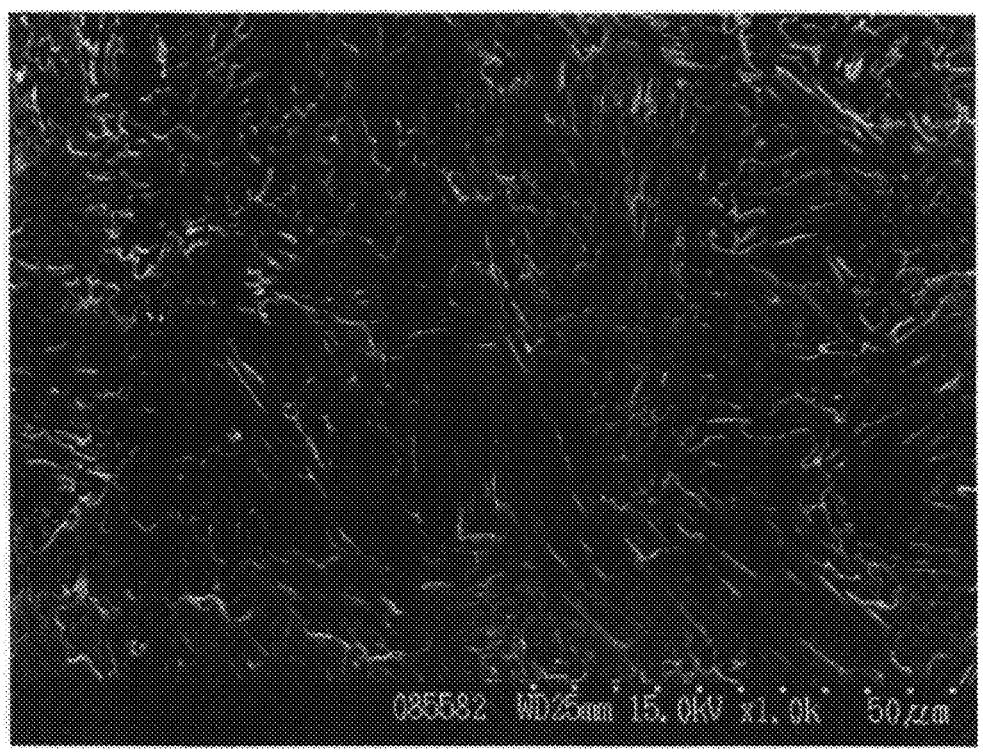
FIG. 3 is a SEM image of a surface of a present invention material A.

The proportion of carbon and chromium was determined in the surface of each of the present invention material A and the comparative material Z1 in the following manner. The results are also shown in Table 1 above. In addition, a SEM image of the surface of the comparative material Z1 is shown in FIG. 2, and a SEM image of the surface of the present invention material A is shown in FIG. 3.

—Measurement Method of the Proportion of Carbon and Chromium

This measurement was conducted using an electron probe X-ray microanalyzer. Specifically, the surface of each of the materials was irradiated with electron probe, and the emitted characteristic X-ray was measured to carry out an elementary analysis.

As clearly seen from Tables 1 and 2, it is observed that the present invention material A has a lower proportion of chromium and a higher proportion of carbon than the comparative material Z1. Judging from the proportion of carbon and chromium as well, it is observed that it is substantially equivalent to the composition of $Cr_3C_2$, resulting in a stable chromium carbide layer. On the other hand, the comparative material Z1 has a high proportion of chromium. This means that unreacted chromium remains, so it is instable as the chromium carbide layer. It is also believed that the particles resulting therefrom are not sufficiently inhibited.

Experiment 4

Figure 4:
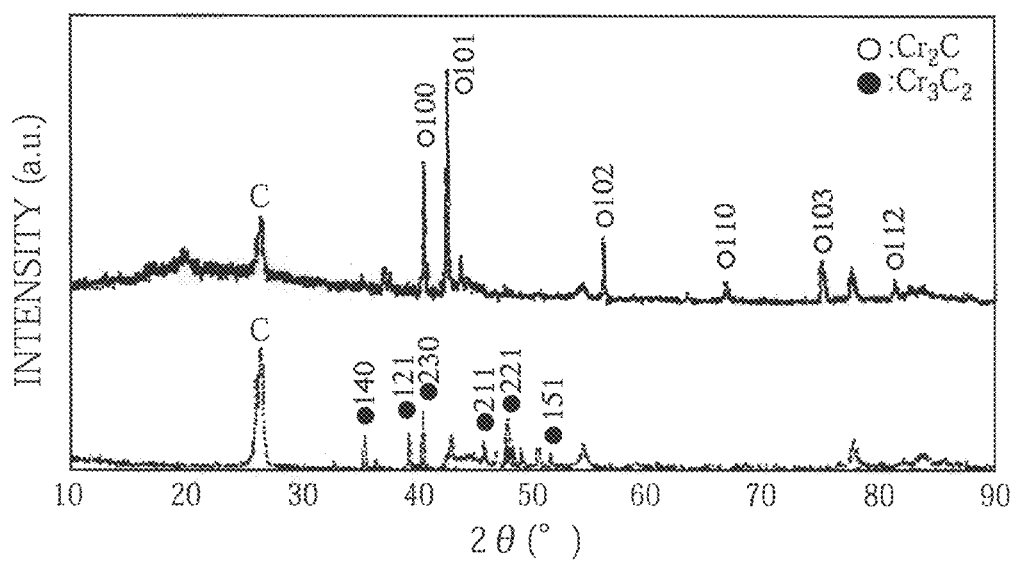
FIG. 4 is a graph illustrating an X-ray diffraction chart for the present invention material A and the comparative material Z1.

An X-ray diffraction pattern analysis (radiation source: CuKα) was performed for each of the present invention material A and the comparative material Z1. The results are shown in FIG. 4. In FIG. 4, the upper line represents the chart for the comparative material Z1, and the lower line represents the chart for the present invention material A1.

As is clear from FIG. 4, in the present invention material A, the chromium carbide layer has a rhombic structure mainly containing $Cr_3C_2$. In contrast, it is observed that in the comparative material Z1, the chromium carbide layer is mainly composed of $Cr_2C$.

As described above, in the present invention material A, the chromium carbide layer is stabilized because the chromium carbide layer mainly has a rhombic structure, so the formation of particles is inhibited more effectively. Moreover, as seen from FIG. 3, the present invention material A shows that crystals are well developed in the surface thereof, so the particle inhibiting effect is believed to be high.

On the other hand, the chromium carbide layer on the surface of the comparative material Z1 has a crystal structure composed mainly of $Cr_2C$. Moreover, as seen from FIG. 2, the comparative material Z1 shows that crystals are not well-developed in the surface thereof and the structure is unclear, so it is believed to be instable.

Other Embodiments (1) In the foregoing Example, a carbon material prepared by heat-treating a carbon substrate embedded in a surface modifying agent containing chromium particles and a pyrolytic hydrogen halide generating agent or the like, together with a carbon member other than the carbon substrate was used as the carbon material (the carbon material prior to being subjected to the heat treatment in the second step). However, the carbon material is not limited thereto. Any carbon material prepared by any kind of manufacturing method, such as ones shown in the previously-mentioned Patent Literature 1 and 2, makes it possible to reduce the particles because chromium carbides other than $Cr_3C_2$ are converted into $Cr_3C_2$ by conducting the heat treatment.

(2) In the foregoing Example, the chromium carbide layer prior to the heat treatment is composed of $Cr_2C$. However, the chromium carbide layer is not limited thereto but may be composed of $Cr_7C_3$ or $Cr_{23}C_6$, or mixtures thereof. In addition, the chromium carbide layer prior to the heat treatment may contain $Cr_3C_2$. In this case, when the heat treatment is performed, chromium carbides other than $Cr_3C_2$ are converted into $Cr_3C_2$, while $Cr_3C_2$ is kept as it is.

INDUSTRIAL APPLICABILITY

The carbon material and the method of manufacturing the same according to the present invention can be used for members of a semiconductor manufacturing apparatus, jigs for manufacturing electronic devices (sensors or the like), and positioning jigs used in bonding different materials to each other.

REFERENCE SIGNS LIST

1—Furnace
2—Carbon substrate
3—Powder
4—Gas inlet port
5—Gas exhaust port
6—Graphite crucible
7—Lid

The invention claimed is:

1. A carbon material comprising a carbon substrate and a chromium carbide layer formed on a surface of the carbon substrate, wherein the chromium carbide layer comprises $Cr_3C_2$ as its main component and has a thickness of not less than 1 μm and less than 50 μm,
wherein the number of particles of 0.2 μm or greater is less than 100 per 100 mm² of the surface of the carbon material, the number of particles being determined by immersing and washing the carbon material in pure water, thereafter applying an ultrasonic wave to the washed carbon material in 3000 mL of pure water to extract particles, and counting the number of the particles with a particle counter.

2. The carbon material according to claim 1, wherein the number of particles of 0.1 μm or greater is less than 1000 per 100 mm² of the surface of the carbon material, the number of particles being determined by immersing and washing the carbon material in pure water, thereafter applying an ultrasonic wave to the washed carbon material in 3000 mL of pure water to extract particles, and counting the number of the particles with a particle counter.

3. The carbon material according to claim 2, wherein the chromium carbide layer has a rhombic structure.

4. The carbon material according to claim 1, wherein the chromium carbide layer has a rhombic structure.

5. A jig made of a carbon material according to claim 1.

6. A carbon material comprising a carbon substrate and a chromium carbide layer formed on a surface of the carbon substrate, wherein the chromium carbide layer comprises $Cr_3C_2$ as its main component and has a thickness of not less than 1 μm and less than 50 μm,
wherein the number of particles of 0.1 μm or greater is less than 1000 per 100 mm² of the surface of the carbon material, the number of particles being determined by immersing and washing the carbon material in pure water, thereafter applying an ultrasonic wave to the washed carbon material in 3000 mL of pure water to extract particles, and counting the number of the particles with a particle counter.

7. The carbon material according to claim 6, wherein the chromium carbide layer has a rhombic structure.

8. A jig made of a carbon material according to claim 6.

9. A method of manufacturing a carbon material, comprising:
a first step of forming a chromium carbide layer containing a chromium carbide other than $Cr_3C_2$ on a surface of a carbon substrate; and
a second step of heat-treating the carbon substrate under a reducing atmosphere to convert the chromium carbide other than $Cr_3C_2$ into $Cr_3C_2$,
wherein, in the first step, a carbon substrate embedded in a surface modifying agent containing chromium particles and a pyrolytic hydrogen halide generating agent is heat-treated together with a carbon member other than the carbon substrate, to form the chromium carbide layer containing a chromium carbide other than $Cr_3C_2$ on the surface of the carbon substrate.

10. The method of manufacturing a carbon material according to claim 9, wherein the chromium carbide other than $Cr_3C_2$ comprises at least one chromium carbide selected from the group consisting of $Cr_2C$, $Cr_7C_3$, and $Cr_{23}C_6$.

11. The method of manufacturing a carbon material according to claim 9, wherein the reducing atmosphere is a hydrogen gas atmosphere.

12. The method of manufacturing a carbon material according to claim 9, wherein, in the second step, the heat treatment is performed at from 500° C. to 1500° C.

13. The method of manufacturing a carbon material according to claim 9, wherein, in the second step, the heat treatment is performed under a reduced pressure of from 10 Pa to 1000 Pa.

* * * * *